United States Patent [19]

Yoshimura

[11] Patent Number: 5,629,642

[45] Date of Patent: May 13, 1997

[54] POWER SUPPLY MONITOR

[75] Inventor: Yoshimasa Yoshimura, Tokyo, Japan

[73] Assignee: Mitsubishi Denki Kabushiki Kaisha, Tokyo, Japan

[21] Appl. No.: 579,135

[22] Filed: Dec. 27, 1995

[30] Foreign Application Priority Data

Aug. 18, 1995 [JP] Japan ................. 7-210570

[51] Int. Cl.$^6$ .................. H03L 7/00; H03K 3/02
[52] U.S. Cl. .......... 327/142; 327/143; 327/162; 327/198
[58] Field of Search ................. 327/142, 143, 327/162, 198

[56] References Cited

U.S. PATENT DOCUMENTS 4,367,423  1/1983  Hornung ................. 327/143

*Primary Examiner*—David C. Nelms
*Assistant Examiner*—Trong Phan

[57] ABSTRACT

In a power supply monitor which outputs a reset signal when the power supply voltage decreases, a first voltage is generated by a first voltage generator in proportion to a power supply voltage, and a comparator supplying a first signal when the first voltage becomes lower than a reference voltage. On the other hand, a slewing rate detector supplies a second signal when a slewing rate of decreasing in power supply voltage is larger than a threshold value. Then, a signal generator supplying a signal set by a trailing edge of the second signal received from the slewing rate detector except a period after the second signal is received and reset by a trailing edge of the first signal received from the comparator. That is, even if the power supply voltage decreases, the monitor does not generate a reset signal when the decrease in the power supply voltage is instantaneous.

10 Claims, 8 Drawing Sheets

5,629,642

POWER SUPPLY MONITOR

BACKGROUND OF THE INVENTION

1. Field of the Invention

The present invention relates to a power supply monitor which monitors a drop of a voltage supplied by a power supply in an apparatus such as a memory card which needs back-up of data.

2. Description of the Prior Art

An apparatus such as a SRAM (static random access memory) card holding data in a volatile memory needs a power supply monitor which generates a reset signal for inactivating the memory or a control IC therefor when the power supply voltage decreases below a certain voltage.

In a previous power supply monitor, a comparator compares a power supply voltage with a threshold voltage, and it generates a reset signal when the power supply voltage decreases lower than the threshold voltage. The comparator is required to respond the drop in voltage without delay because the reset signal has to be supplied before the power supply voltage decreases but still serves back-up of data. However, if the comparator responds with no delay, the reset signal is generated even for an instantaneous voltage drop, for example, when a noise superposes the power supply voltage, though such instantaneous voltage drop does not affect the data stored in the memory. If the power supply monitor is used under a bad environment having much noises, such a system including the power supply monitor is practically always reset, and this is very inconvenient. Therefore, if a system such as a SRAM card has a power supply monitor, the system itself has to prepare a countermeasure, for example, by removing noises.

SUMMARY OF THE INVENTION

An object of the present invention is to provide an power supply monitor which generates a reset signal for voltage drop of power supply voltage, but does not generate a reset signal for instantaneous voltage drop.

In a power supply monitor of the invention, a first voltage is generated by a first voltage generator in proportion to a power supply voltage, and a comparator supplying a first signal when the first voltage becomes lower than a reference voltage. On the other hand, a slewing rate detector supplies a second signal when a slewing rate of decreasing in power supply voltage is larger than a threshold value. Then, a signal generator supplying a signal set by a trailing edge of the second signal received from the slewing rate detector except a period after the second signal is received and reset by a trailing edge of the first signal received from the comparator. That is, even if the power supply voltage decreases, the monitor does not generate a signal when the decrease in the power supply voltage is instantaneous. Preferably, the signal generator comprises a delay means delaying the first signal received from the comparator by a prescribed time, and a NAND gate performing a NAND operation of the first signal and the second signal received from said slewing rate detector. An output signal of the NAND gate is supplied as a signal to set the signal output by the signal generator.

An advantage of the present invention is that a reset signal is not output for an instantaneous noise superposing the power supply voltage.

BRIEF DESCRIPTION OF THE DRAWINGS

These and other objects and features of the present invention will become clear from the following description taken in conjunction with the preferred embodiments thereof with reference to the accompanying drawings, and in which.

DETAILED DESCRIPTION OF THE PREFERRED EMBODIMENTS

Figure 1:
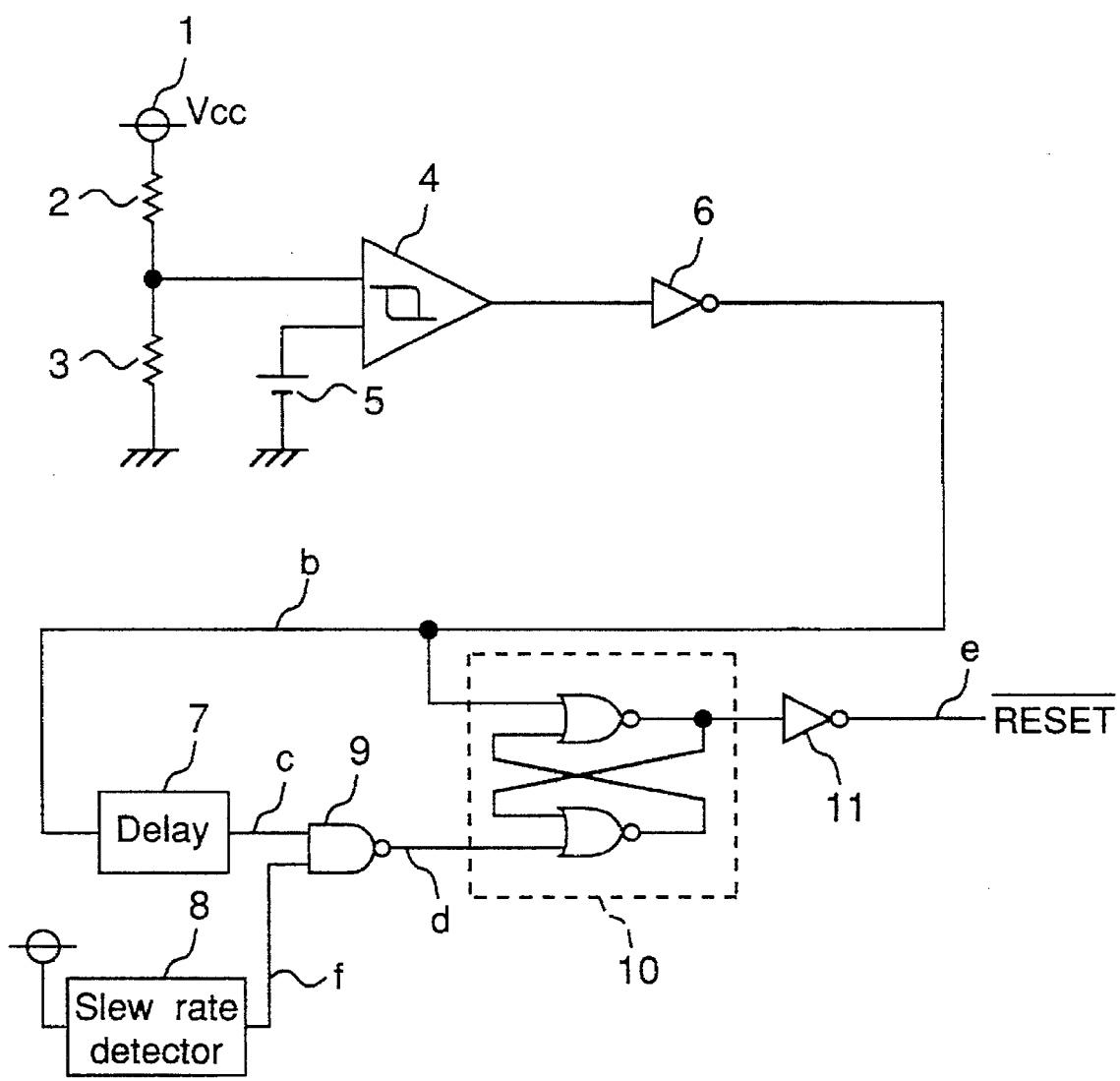
FIG. 1 is a circuit diagram of a power supply monitor of an embodiment of the invention.

Referring now to the drawings, wherein like reference characters designate like or corresponding parts throughout the drawings, FIG. 1 shows a circuit diagram of a power supply monitor of an embodiment of the invention. The power supply monitor is provided, for example, in a memory card. Power supply voltage $V_{cc}$ supplied from a power supply (not shown) is divided by resistors 2 and 3 to generate a first voltage. The first voltage is a constant voltage if the power supply voltage is stable. A comparator 4 compares the first voltage with a reference voltage supplied by a reference voltage generator 5. An output of the comparator 4 is sent through a buffer inverter 6 to one input of a flip flop 10 and to a delay circuit 7. The output c of the delay circuit 7 is sent to an input of a NAND gate 9. On the other hand, a slewing rate detector 8 detects a slewing rate of decreasing in power supply voltage as will be explained later, an output f of the slewing rate detector 8 is sent to another input of the NAND gate 9. The NAND gate 9 performs NAND operation and send a result output thereof to another input of the flip flop 10. The flip flop 10 is an R-S flip flop made of two NOR gates, and the output of the flip flow 10 is sent through a buffer inverter 11 to provide a $\overline{\text{RESET}}$ signal for inactivating the memory or a control IC therefor when the power supply voltage decreases below a certain voltage. The flip flop 10 is set by a trailing edge of the output signal of the NAND gate 9, and reset by a trailing edge of the output of the inverter 6 or by a return of the power supply voltage to normal value.

Before explaining the entire operation of the power supply monitor shown in FIG. 1, the slewing rate detector 8 is explained with reference to FIG. 2. The slewing rate is used to decide if the decrease in power supply voltage $V_{cc}$ is caused by instantaneous noises in power supply line or shut-off of the power supply. The slewing rate detector 8 comprises a first generator 18 generating a first voltage V1, a second generator 19 generating a second constant voltage V2, a comparator 20 comparing the first and second voltages, and a signal holding circuit 26 holding the output signal of the comparator 20 for a certain time and sends it to the NAND gate 9 (shown in FIG. 1).

In the first generator 18, a constant current source 12, a resistor 13, a diode 14 and a constant current sink 15 are connected in series between the power supply 1 and the ground. A connection point between the constant current supplier 12 and the resistor 13 is connected to an input of a comparator 20 and it is also connected through a capacitor 17 to the power supply voltage $V_{cc}$ and through a transistor 16 to the ground for bypassing a current. A base of the transistor 16 is connected to a connection point between the diode 14 and the constant current sink 15. The second generator 19 generates a second constant voltage V2 which is somewhat smaller than the first voltage V1 when the first voltage V1 is stable, and supplies it to another input of the comparator 20. The first voltage V1 has AC coupling through the capacitor 17 to the power supply line, while it is affected by noises in the power supply line. Then, the comparator 20 compares the first voltage V1 with the second constant voltage V2 insulated electrically from the power supply line in order to detect noises. The output of the comparator 20 is sent to the signal holding circuit 26.

In the signal holding circuit 26, a constant current source 25 and an inverter including MOSFETs 21 and 22 are connected in series between the power supply 1 and the ground. An output of the inverter is connected to an input of an inverter 24 and to the ground through a capacitor 23. The output of the inverter 24 is sent to the NAND gate 9 (FIG. 1).

In the first generator 18, because the capacitor 17 is charged with a difference current between the current supplied from the constant current source 12 and the current taken from the constant current sink 15, a time which attains a stable DC voltage can be adjusted quantitatively. A current $I_1$ is supplied by the constant current source 12, while a difference current $I_2$ smaller than $I_1$ is discharged by the constant current sink 15. When the power supply voltage $V_{cc}$ is stable, a difference current $I_1-I_2$ is bypassed through the transistor 16. If the power supply voltage decreases at a slewing rate of $\Delta V_{cc}/\Delta t$, the first voltage V1 also decreases at the slewing rate of $\Delta V_{cc}/\Delta t$ through the capacitor 17. At this time, the difference current $I_1-I_2$ is charged in the capacitor 17 so as to return the first voltage V1 to the stable DC value. That is, the first voltage V1 decreases but tends to return to the stable DC value due to charging to the capacitor 17. If a return capability with the capacitor 17 to the stable DC value is larger than the slewing rate $\Delta V_{cc}/\Delta t$, the first voltage V1 changes as shown in (b), or it is always larger than the second constant voltage V2. On the other hand, if the slewing rate $\Delta V_{cc}/\Delta t$ is larger than the return capability, the first voltage V1 becomes smaller than the second constant voltage V2, as shown in (b) in FIG. 3. Thus, it can be detected if the slewing rate is larger than a threshold value or not.

The slewing rate detected by this circuit is expressed as follows:

$$\Delta V_{cc}/\Delta t = (I_1-I_2)/C, \tag{1}$$

wherein C denotes a capacitance of the capacitor 17. Then, if the currents $I_1$ and $I_2$ and the capacitance C are chosen appropriately, any threshold value can be set.

Figure 3:
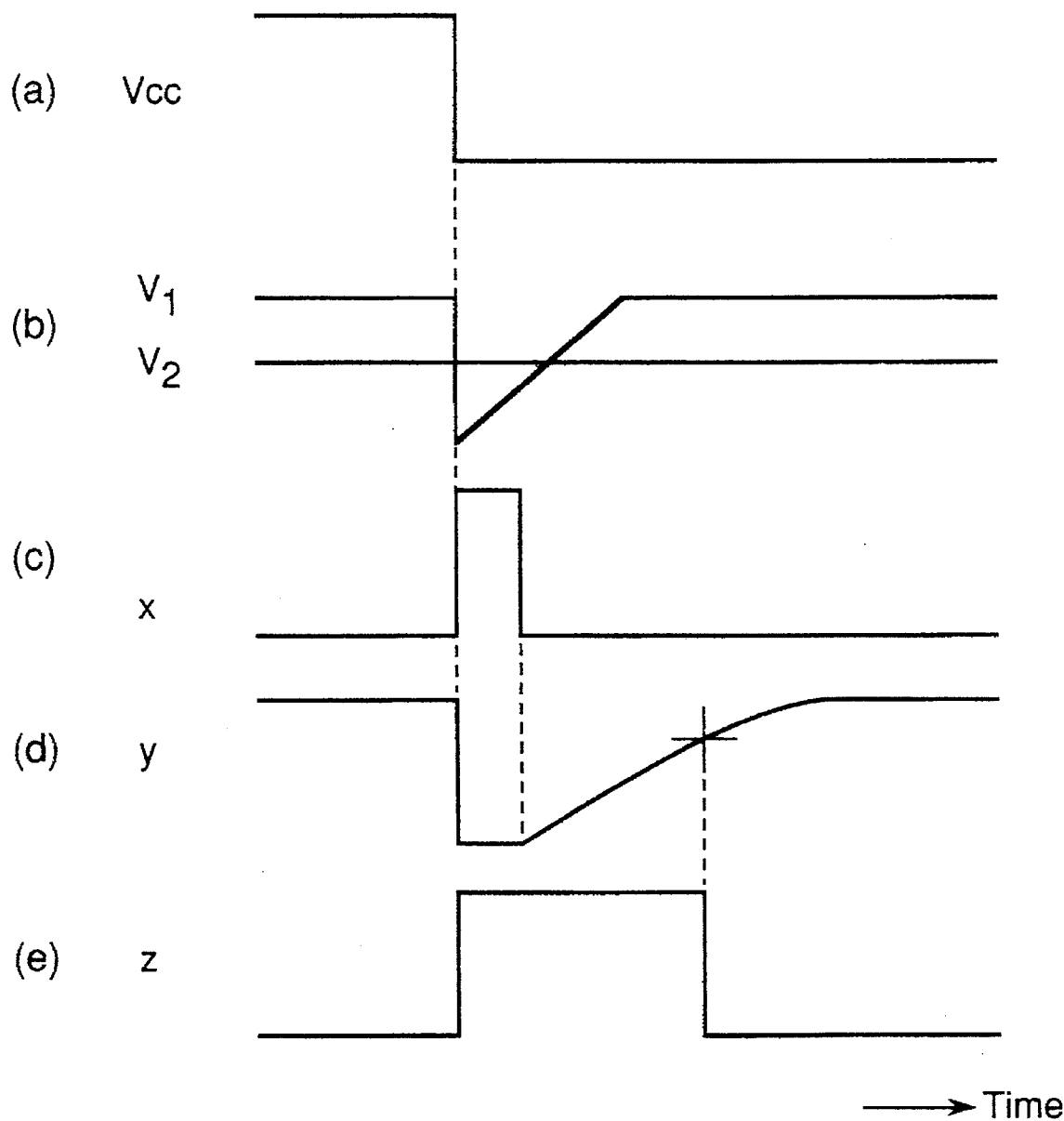
FIGS. 3(a)–(e) show time charts of the slewing rate circuit shown in FIG. 2 when a slewing rate detection signal is generated.

Next, the entire operation of the power supply monitor shown in FIG. 1 is explained with reference to time charts of FIGS. 3 and 4. In the monitor circuit, a noise canceler including the delay circuit 7 and the flip flop 10 is combined with the slewing rate detector 8, and the enable/unable of the noise cancel circuit is changed according to the slewing rate.

The slewing rate detector 8 is explained first. It generates a slewing rate detection signal when the power supply voltage $V_{cc}$ drops rapidly, while it does not generate a slewing rate detection signal when the power supply voltage decreases gradually. FIG. 3 shows detection of a slewing rate detection signal when the voltage decreases rapidly, for example, when a noise in power supply line occurs. FIG. 3 shows that the power supply voltage $V_{cc}$ (a) decreases rapidly, but not so rapidly to stop the operation of the monitor circuit. A change in the first voltage V1 due to the decrease in power supply voltage beside the second power supply line V2, as shown in (b). When the power supply voltage $V_{cc}$ drops as shown in (a), the voltage V1 becomes lower than the voltage V2 temporarily, as shown in (b), and the comparator 20 outputs a detection signal (point "x") temporarily, as shown in (c). The signal holder 26 is provided to hold the detection signal. Then, when the signal holder 26 receives the detection signal, the inverter comprising MOSFETs 21 and 22 is turned on, and the capacitor 23 is charged by the constant current source 25, and the signal at point "y" changes as shown in (d) or returns gradually. Then, the slewing rate detection signal output by the inverter 24 (at point "f") changes as shown in (e), or the detection signal is held until the capacitor 23 is charged. The pulse width of the slewing rate detection signal can be adjusted by the current value of the constant current source 25, the capacitance of the capacitor 23 and the threshold value of the inverter 24.

Figure 4:
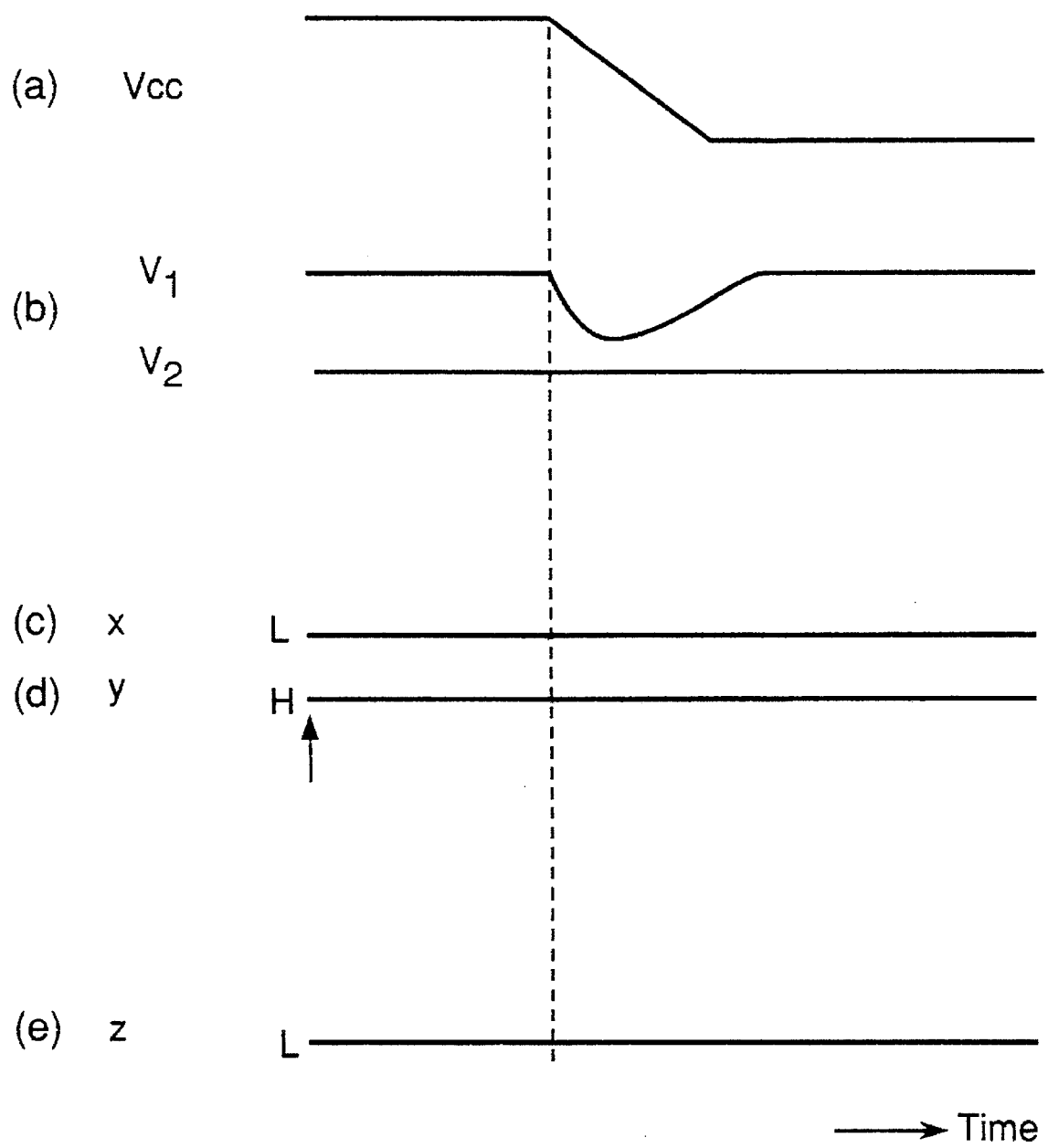
FIGS. 4(a)–(e) show time charts of the slewing rate circuit shown in FIG. 2 when a slewing rate detection signal is not generated.

FIG. 4 shows generation of a slewing rate detection signal when the voltage decreases gradually, for example, when the power supply is turned off. As shown in (a), the power supply voltage $V_{cc}$ decreases gradually in a range where the operation of the monitor circuit does not stop. As shown in (b), a change in the first voltage V1 due to the decrease in power supply voltage beside the second constant voltage V2. When the power supply voltage $V_{cc}$ decreases gradually as shown in (a), the voltage V1 does not become lower than the voltage V2, as shown in (b), and the comparator 20 does not output a detection signal, as shown in (c). Then, the slewing rate detection signal (at point "f",) is not output by the inverter 24, as shown in (e).

Figure 5:
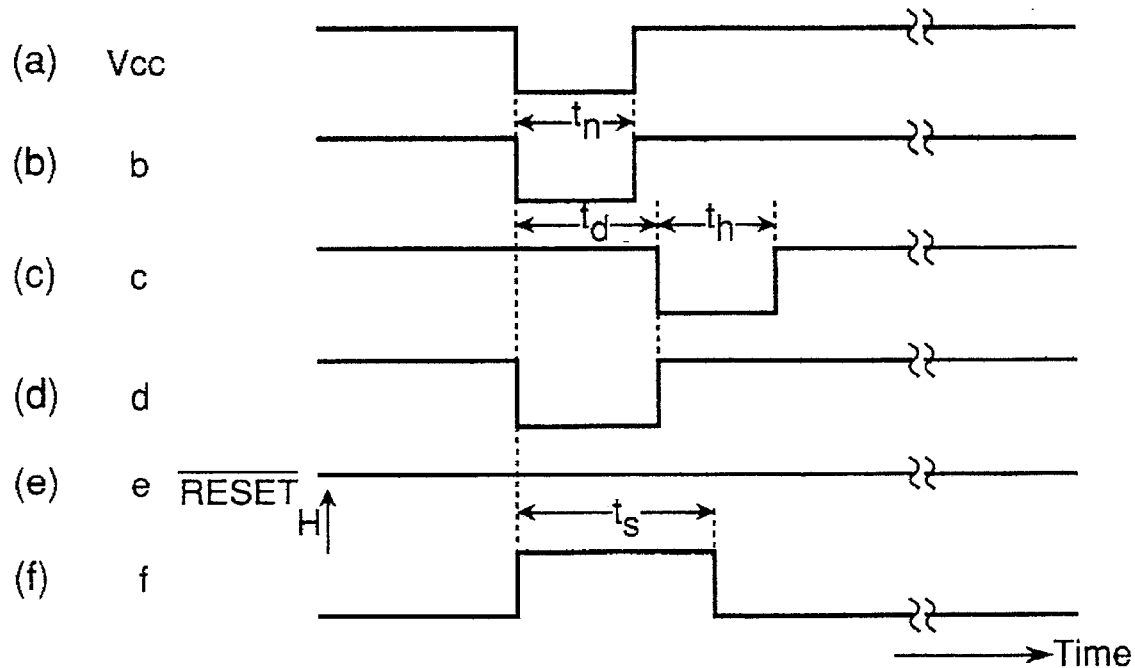
FIGS. 5(a)–(f) show time charts of the power supply monitor when a reset signal is not generated while noises occur.
Figure 6:
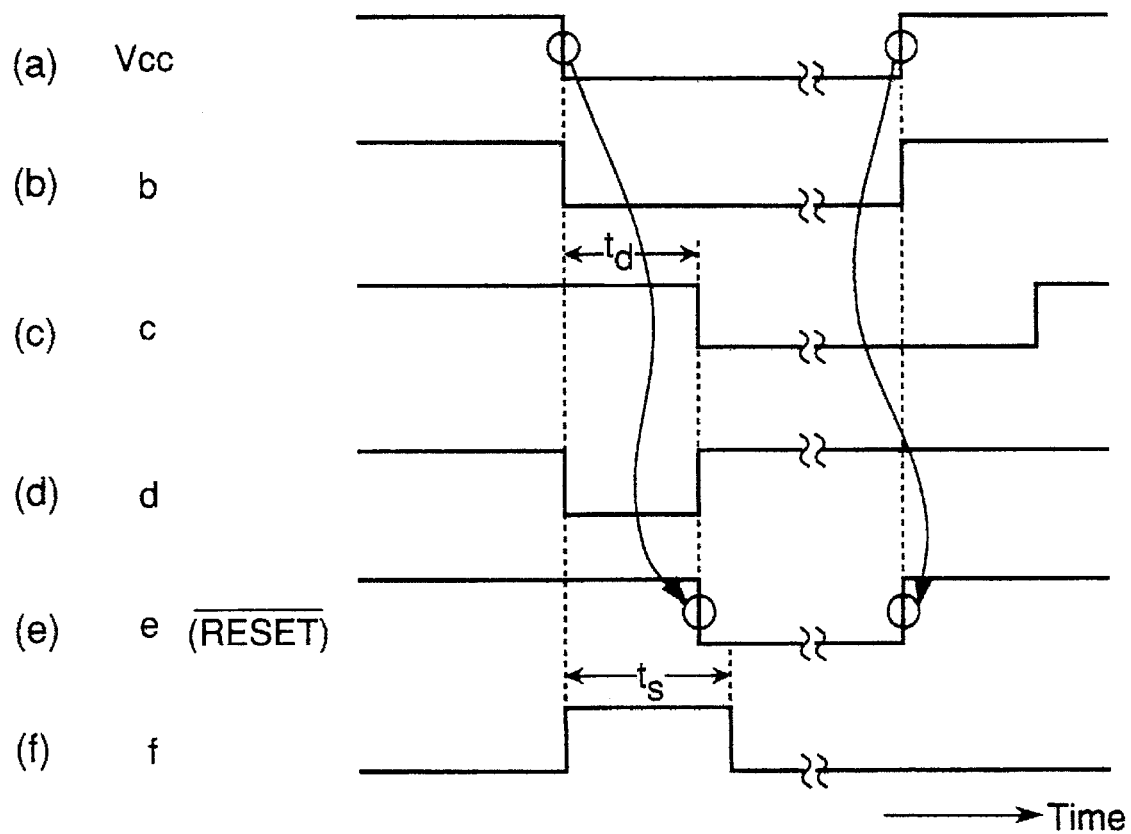
FIGS. 6(a)–(f) show time charts of the power supply monitor when a reset signal is generated while noises occur.
Figure 7:
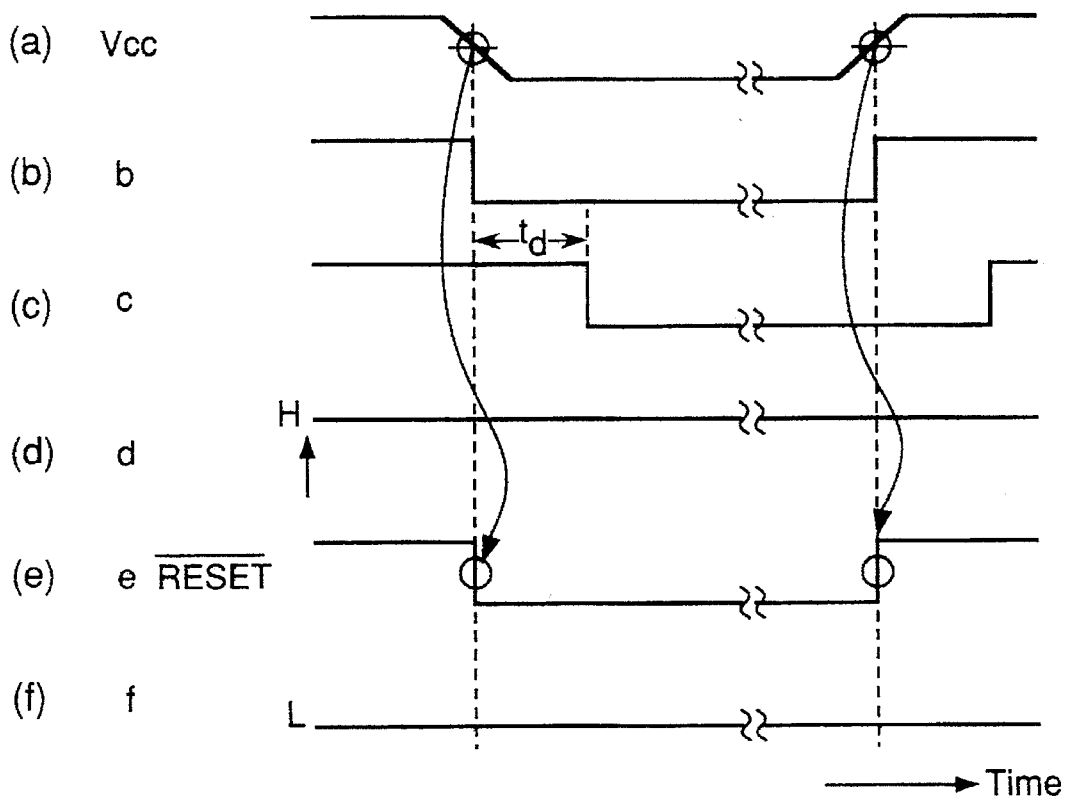
FIGS. 7(a)–(f) show time charts of the power supply monitor when a reset signal is generated when the power supply is turned off.

Next, the operation of the power supply monitor is explained when the power supply voltage decreases with reference to time charts shown in FIGS. 5-7 in three cases:

(1) A first case where the power supply voltage decreases due to an instantaneous noise.

In this case, the noise is canceled or a $\overline{\text{RESET}}$ signal is not output. FIG. 5 shows time charts in this case. When an instantaneous noise happens in the power supply line of width of $t_n$, as shown in (a), the comparator 4 outputs a detection signal through the buffer 6, as shown in (b), and the delay circuit 7 delays the detection signal by a time $t_d$ longer than $t_n$, as shown in (c). Because the decrease in power supply voltage $V_{cc}$ is rapid, the slewing rate detector 8 outputs a slewing rate detection signal, as shown in (f), which starts at the decrease in $V_{cc}$ and has a width $t_s$ longer than $t_d$. The NAND gate 9 outputs a result of NAND operation, as shown in (d). The flip flop 10 latches the outputs (b) and (d), and in this case, it does not change its output because the pulse width $t_n$ of the noise is shorter than the delay time $t_d$ of the delay circuit 7. Then, the inverter 11 keeps the output at L level. Thus, the instantaneous noise is canceled, and the $\overline{RESET}$ signal is not output, as shown in (e).

(2) A second case where the power supply voltage decreases due to a relatively long noise.

In this case, the pulse width of the noise is longer than the delay time of the delay circuit 7, and the $\overline{RESET}$ signal is output. FIG. 6 shows time charts in this case. When a noise in the power supply line having a relatively long width happens, as shown in (a), the comparator 4 outputs a detection signal through the inverter 6, as shown in (b), and the delay circuit 7 delays the detection signal, as shown in (c). Because the decrease in power supply voltage $V_{cc}$ is rapid, as shown in (a), the slewing rate detector 8 outputs a slewing rate detection signal, as shown in (f). The NAND gate 9 outputs a result of NAND operation, as shown in (d). The flip flop 10 latches the outputs (b) and (d), and in this case, it changes its output because the pulse width of the noise is longer than the delay time $t_d$ of the delay circuit 7. Then, the inverter 11 changes the output to H level. Thus, the noise is not canceled, or the $\overline{RESET}$ signal is output, as shown in (e).

As described above, when the power supply voltage $V_{cc}$ decreases or when the slewing rate is large, it can be adjusted to output a $\overline{RESET}$ signal. This is possible by setting the delay time $t_d$ of the delay circuit 7 at a maximum pulse width of a noise which is desired to be canceled. For example, if a noise having a width shorter than 1 μsec is desired to be canceled or a $\overline{RESET}$ signal is desired to be output for a noise having a width of 1 μsec or longer, the delay time is set at 1 μsec. That is, the delay time $t_d$ plays a role of threshold time of the noise cancel. In this case, the pulse width $t_n$ of a noise to be canceled, the delay time $t_d$ of the delay circuit 7 and a pulse width $t_s$ of the slewing rate detection signal satisfies a following relation:

$$t_n \leq t_d < t_s. \quad (2)$$

(3) A third case where the power supply is turned down and $\overline{RESET}$ signal is output.

FIG. 7 shows a time chart of the power supply monitor where a reset signal is generated when the power supply is turned off. In this case, the power supply is turned down and the power supply voltage $V_{cc}$ decreases as shown in (a). At the same time, the comparator 4 outputs a detection signal through the inverter 6, as shown in (b). The delay circuit 7 delays the detection signal, as shown in (c). When the power supply is turned down, the decrease in the power supply voltage $V_{cc}$ is gradual. Then, the slewing rate detector 8 does not output a slewing rate detection signal, and the detector keeps to output the same L level, as shown in (f). Then, the NAND gate 9 outputs H level, as shown in (d). In this case, the flip flop 10 latches the output (b), to output the $\overline{RESET}$ signal, as shown in (e), or the $\overline{RESET}$ signal is output when the power supply voltage is low.

As explained above, the power supply monitor of the embodiment outputs a reset signal, if necessary, when the power supply voltage decreases. That is, it can decide if a cause of the decrease in power supply voltage is ascribed to a noise in power supply line or turning off the power supply, and if it is decided to be ascribed to the turning off the power supply, a time period of decrease in voltage is checked. If the time period is longer than a threshold value, a reset signal is output because a trouble happens. On the other hand, if the time period is shorter than a threshold value, a reset signal is not output (noise cancel) because it is ascribed to an instantaneous noise. A slewing rate of the decrease in the power supply voltage $V_{cc}$ is used as a criterion to decide if the decrease in power supply voltage is ascribed to an instantaneous noise or a trouble. That is, when the power supply voltage decreases due to a noise in power supply line, the slewing rate is high (a rate of decreasing in voltage is large), while when the power supply voltage decreases by a trouble in the power supply, the slewing rate is low (a rate of decreasing in voltage is small). It is to be noted that the capacitor 17 is adjusted so as not to decrease the voltage at a slewing rate larger than a prescribed value. Further, the output of the reset signal, when a noise is detected, depends on a relation of the delay time of the delay circuit 7 to the pulse width of a noise to be canceled. In other words, a noise having a pulse width shorter than the delay time is canceled, and a reset signal is not output for the noise.

In the embodiment shown in FIG. 1, a noise cancel circuit, comprising: the delay circuit 7, NAND circuit 9 and the flip flop 10, is used besides the slewing rate detector 8. However, other circuits may also be used to perform the same function.

Figure 2:
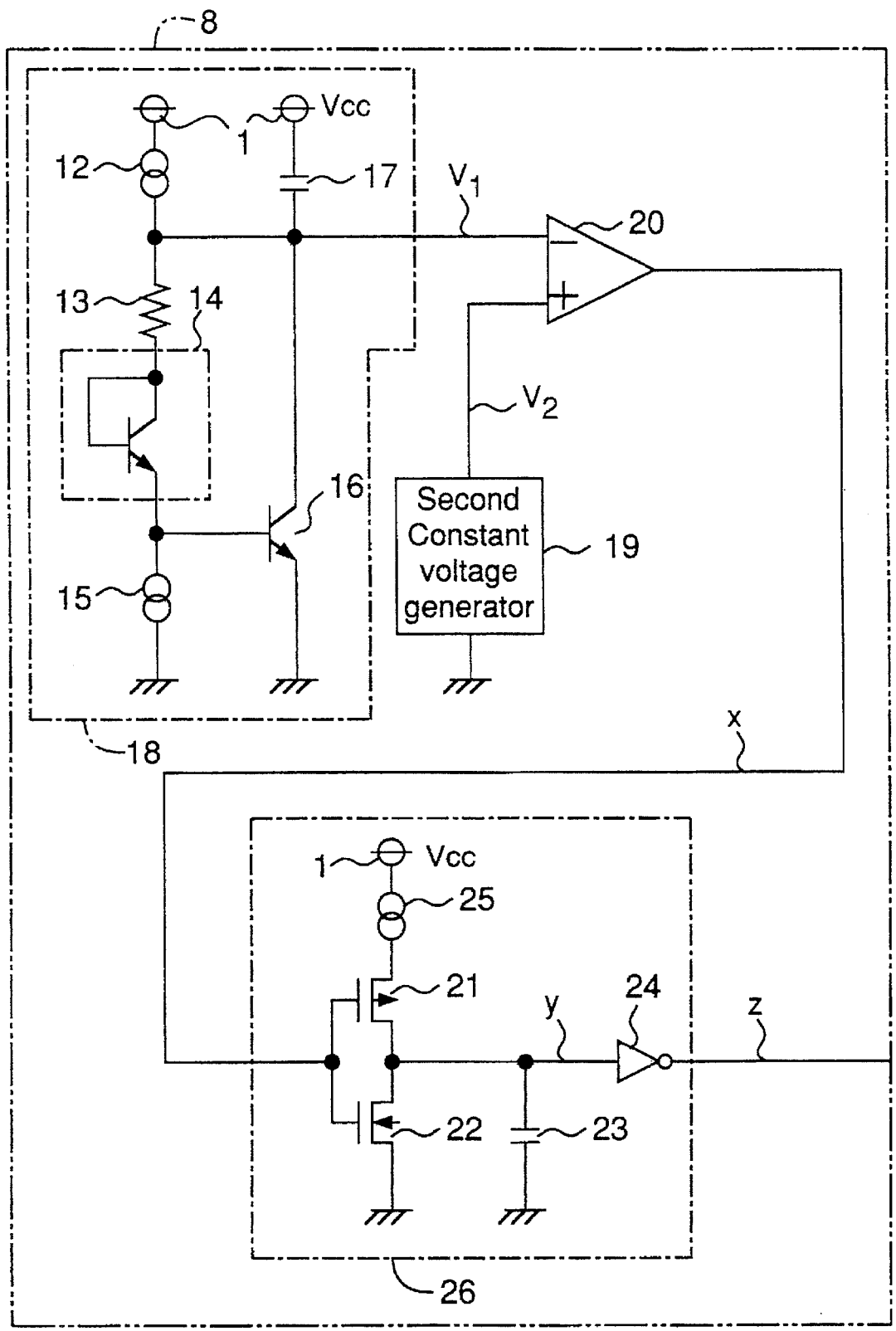
FIG. 2 is a circuit diagram of a slewing rate detection circuit.
Figure 8:
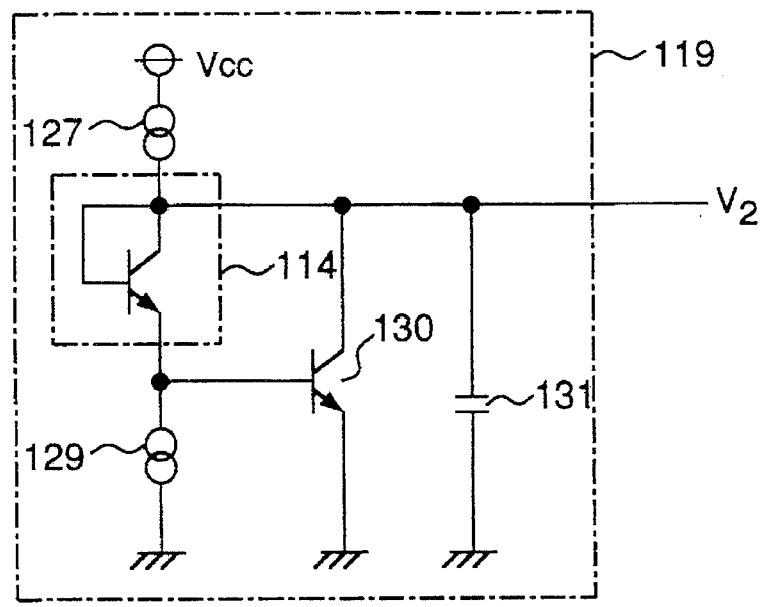
FIG. 8 is a circuit diagram of an example of a second constant voltage generator.

FIG. 8 is a circuit diagram of the second constant voltage generator 19 in the slewing rate detector 8 shown in FIG. 2. A constant current source 127, a diode 114 and a constant current sink 129 are connected in series between the power supply and the ground. A connection point between the constant current source 127 and the diode 114 is connected to an input of a transistor 130 and a capacitor 131, both connected to the ground. A base of the transistor 130 is connected to a connection point between the diode 114 and the constant current sink 129, while an emitter thereof is connected to the ground. This circuit is similar to that of the first generator 18, and a difference between the voltages V1 and V2 can be provided at a high precision irrespective of temperature and power supply voltage. It is a feature that a capacitor is not used in contrast to the first generator 18, and this makes it hard for the second generator 19 to be affected by change in power supply voltage. In the first generator 18 shown in FIG. 2, a voltage drop at the resistor 13 assures a voltage difference between V1 and V2.

Figure 9:
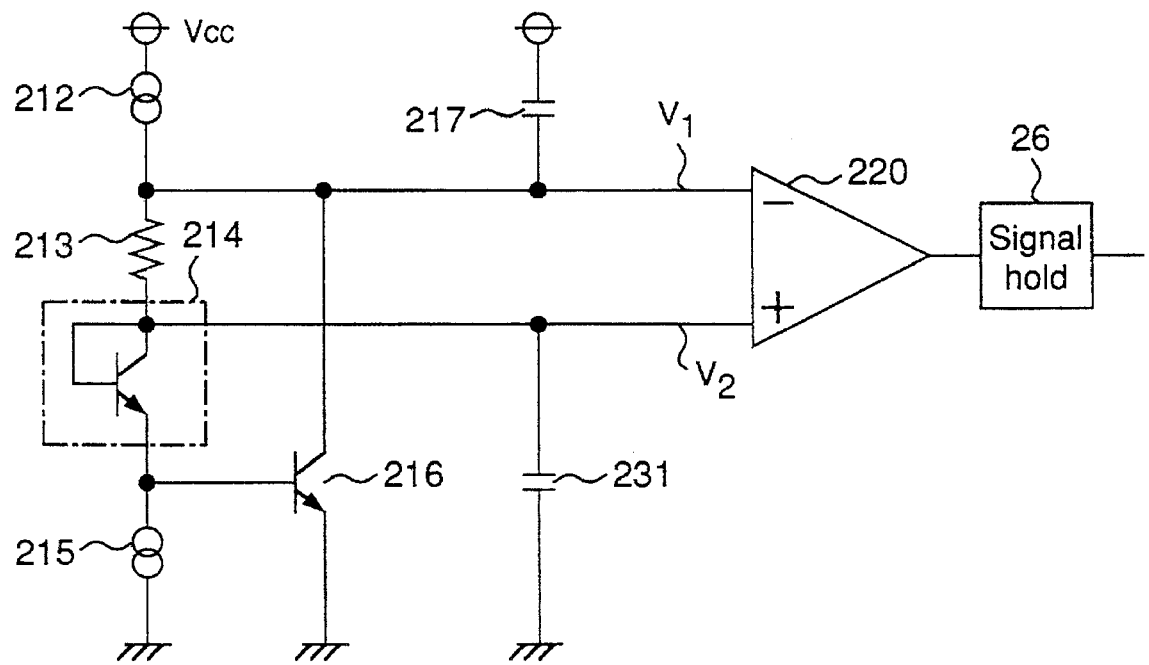
FIG. 9 is a circuit diagram of an element of a voltage generator.
Figure 10:
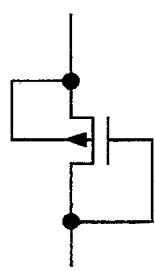
FIG. 10 is a diagram of an example of a device which can be used instead of a diode used in the first and second voltage generators.
Figure 11:
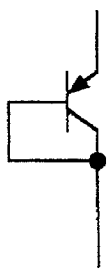
FIG. 11 is a diagram of another example of a device which can be used instead of a diode used in the first and second voltage generators.

FIG. 9 shows another example of the first and second generators and a comparator. A constant current source 212, a resistor 213, a diode 214 and a constant current sink 215 are connected in series between the power supply and the ground. A connection point between the constant current source 212 and the resistor 213 is connected through a capacitor 217 to the power supply line and through a transistor 216 to the ground. The connection point is also connected to an input of a comparator 220. A base of the transistor 216 is connected to a connection point between the diode 214 and the constant current sink 215, while an emitter thereof is connected to the ground. A connector point between the resistor 213 and the diode 214 is connected through another capacitor 231 to the ground and to another input of the comparator 220. A voltage drop at the resistor 213 provides a difference between the voltages V1 and V2. Further, because the first and second voltages are connected to the power supply line and to the ground. Then, even when the power supply voltage $V_{cc}$ changes, the second constant voltage V2 is more hard to be affected by the power supply voltage than the first one V2. In this circuit, a large part of the circuit for generating V1 and V2 is common, so that a number of the components can be decreased. Thus, an area of the circuit is small when it is provided in an integrated circuit.

Figure 12:
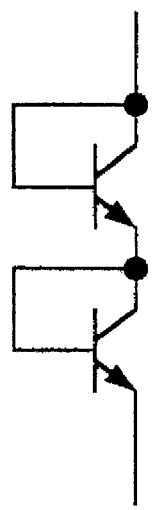
FIG. 12 is a diagram of a different example of a device which can be used instead of a diode used in the first and second voltage generators.
Figure 13:
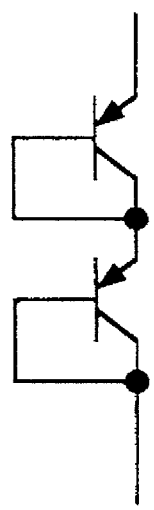
FIG. 13 is a diagram of a still different example of a device which can be used instead of a diode used in the first and second voltage generators.

FIGS. 10–13 show examples of a device which can be used instead of a diode used in the first and second voltage generators. Instead of the diode 14 in FIG. 2 or the diode 114 in FIG. 8, a PMOS transistor shown in FIG. 10 or a PNP transistor shown in FIG. 11 can be used. Further, a series connection thereof as shown in FIGS. 12 and 13 may also be used.

The power supply monitor explained above has following advantages:

(a) A circuit thereof is simple.

(b) A cause of the decrease in power supply voltage can be decided by detecting the slewing rate on the decrease in power supply voltage, and an output of a reset signal can be controlled according to the decision.

(c) By setting a threshold value of noise cancel, noises to be canceled can be adjusted.

Although the present invention has been fully described in connection with the preferred embodiments thereof with reference to the accompanying drawings, it is noted that various changes and modifications are apparent to those skilled in the art. Such changes and modifications are understood as included within the scope of the present invention as defined by the appended claims unless they depart therefrom.

What is claimed is:

1. A power supply monitor comprising:
    a first voltage generator generating a first voltage in proportion to a power supply voltage;
    a reference voltage generator generating a reference voltage;
    a comparator supplying a first signal when the reference voltage generated by said reference voltage generator is larger than the first voltage generated by said first voltage generator;
    a slewing rate detector supplying a second signal when a slewing rate of decreasing in said power supply voltage is larger than a threshold value; and
    a signal generator supplying a signal set by a trailing edge of the second signal received from said slewing rate detector except a period after the second signal is received and reset by a trailing edge of the first signal received from said comparator.

2. The power supply monitor according to claim 1, wherein said slewing rate detector comprises,
    a first voltage generator generating a first voltage which varies in correspondence with the power supply voltage,
    a second voltage generator generating a second constant voltage which is smaller than the first voltage generated by said first voltage generator when the power supply voltage is not changed,
    a comparator supplying a signal when the first voltage is larger than the second constant voltage, and
    a holding circuit which holds the signal from said comparator to output said second signal from said slewing rate detector.

3. The power supply monitor according to claim 1, wherein said slewing rate detector comprises,
    a first constant current source as a source load of a first constant current supplied to an out, put terminal of the first voltage generator, the first constant current source being connected to the power supply voltage,
    a first capacitor connected between the output terminal of the first voltage generator and the power supply voltage,
    a voltage drop device comprising a resistor and a diode connected in series, the voltage drop device being connected to said first constant current source in the series wherein, the first voltage being generated at one end of said resistor of said voltage drop device at a side of the power supply voltage and the second constant voltage being generated at the other end of said resistor of said voltage drop device at a side: of the ground,
    a second constant current source as a sink load of a second constant current drawn from the output terminal of the first voltage generator, the second constant current being smaller than the first constant current, the second constant current source connected between said voltage drop device and a ground, and
    a bypass means bypassing a difference of the first constant current from the second constant current from the output terminal of the first voltage generator to the ground;
    a second capacitor connected between the output terminal of the second constant voltage generator and the ground;
    a comparator supplying a signal when the first voltage being generated at said one end of said resistor of said voltage drop device at said side of the power supply voltage is smaller than the second constant voltage being generated at said other end of said resistor of said voltage drop device at said side of the ground; and
    a holding circuit which holds the signal from said comparator to supply said second signal.

4. A power supply monitor comprising:
    a first voltage generator generating a first voltage in proportion to a power supply voltage;
    a reference voltage generator generating a reference voltage;
    a comparator supplying a first signal when the reference voltage generated by said reference voltage generator is larger than the first voltage generated by said first voltage generator;
    a slewing rate detector supplying a second signal when a slewing rate of decreasing in said power supply voltage is larger than a threshold value;
    a delay means delaying the first: signal received from said comparator by a prescribed time;
    a NAND gate performing a NAND operation of the first signal and the second signal; and
    a flip flop to output a reset signal, said flip flop being set by a trailing edge of a signal output by said NAND gate and reset by a trailing edge of the first signal.

5. The power supply monitor according to claim 4, wherein said flip flop comprises an R-S flip flop having two NOR gates.

6. The power supply monitor according to claim 4, wherein a delay time of said delay circuit is set to have a maximum pulse width of a noise desired to be cancelled.

7. The power supply monitor according to claim 6, wherein said slewing rate detector comprises,
    a first voltage generator generating a first voltage which varies in correspondence with the power supply voltage,
    a second voltage generator generating a second constant voltage which is smaller than the first voltage generated by said first voltage generator when the power supply voltage is not changed,
    a comparator supplying a signal when the first voltage is larger than the second constant voltage, a holding circuit which holds the signal from said comparator to output said second signal.

8. The power supply monitor according to claim 6, wherein said first voltage generator in said slewing rate detector comprises, a first constant current source as a source load of a first constant current supplied to an output terminal of the first voltage generator, the first constant current source being connected to the power supply voltage, a capacitor connected between the output terminal of the first voltage generator and the power supply voltage, a voltage drop device having a resistor and a diode, the voltage drop device being connected to said first constant current source in series, a second constant current source as a sink load of a second constant current drawn from the output terminal of the first voltage generator, the second constant current being smaller than the first constant current, the second constant current source connected between said voltage drop device and a ground, and a bypass means bypassing a difference of the first constant current from the second constant current from the output terminal of the first voltage generator to the ground.

9. The power supply monitor according to claim 6, wherein said second voltage generator in said slewing rate detector comprises, a third current source as a source load of a third constant current supplied to an output terminal of the second voltage generator, the third current source being connected to the power supply voltage, a voltage drop device comprising a diode, the voltage drop device being connected to said third current source, and a fourth current source as a sink load of a fourth constant current taken from the output terminal of the second voltage generator, the fourth constant current being smaller than the first constant current, the fourth current source being connected between said voltage drop device and said ground, a bypass means bypassing a difference of the third constant current from the fourth constant current from the output terminal of the second voltage generator to the ground, and a capacitor connected between the output terminal of the second voltage generator and the ground.

10. The power supply monitor according to claim 5, wherein said slewing rate detector comprises, a first constant current source as a source load of a first constant current supplied to an output terminal of the first voltage generator, the first constant current source being connected to the power supply voltage, a first capacitor connected between the output terminal of the first voltage generator and the power supply voltage, a voltage drop device comprising a resistor and a diode connected in series, the voltage drop device being connected to said first constant current source in series wherein, the first voltage being generated at one end of said resistor of said voltage drop device at a side of the power supply voltage and the second constant voltage being generated at the other end of said resistor of said voltage drop device at a side of the ground, a second constant current source as a sink load of a second constant current drawn from the output terminal of the first voltage generator, the second constant current being smaller than the first constant current, the second constant current source connected between said voltage drop device and a ground, and a bypass means bypassing a difference of the first constant current from the second constant current from the output terminal to the ground, a second capacitor connected between the output terminal of the second voltage generator and the ground, a comparator supplying a signal when the first voltage being generated at said one end of said resistor of said voltage drop device at said side of the power supply voltage is smaller than the second constant voltage being generated at said other side of said resistor of said voltage drop device at said side of the ground, and a holding circuit which holds the signal from said comparator to supply said second signal.

* * * * *